United States Patent
Lau et al.

(10) Patent No.: US 7,264,668 B2
(45) Date of Patent: Sep. 4, 2007

(54) DECORATIVE HARD COATING AND METHOD FOR MANUFACTURE

(75) Inventors: Leo W. M. Lau, Shatin (HK); Wai Kwong Au, Kowloon (HK)

(73) Assignee: The Chinese University of Hong Kong, Shatin (HK)

( * ) Notice: Subject to any disclaimer, the term of this patent is extended or adjusted under 35 U.S.C. 154(b) by 0 days.

(21) Appl. No.: 09/981,643

(22) Filed: Oct. 16, 2001

(65) Prior Publication Data

US 2003/0072974 A1    Apr. 17, 2003

(51) Int. Cl.
*C09D 1/00* (2006.01)
(52) U.S. Cl. ............................................. 106/286.1
(58) Field of Classification Search ............... 428/336, 428/472, 697, 698, 699; 106/286.1
See application file for complete search history.

(56) References Cited

U.S. PATENT DOCUMENTS

| | | | |
|---|---|---|---|
| 4,599,281 A * | 7/1986 | Schintlmeister et al. .... | 428/699 |
| 4,608,098 A * | 8/1986 | Hale .......................... | 148/276 |
| 4,714,660 A * | 12/1987 | Gates, Jr. .................... | 428/698 |
| 4,731,302 A * | 3/1988 | Weissmantel et al. ...... | 428/698 |
| 4,758,280 A * | 7/1988 | Bergmann et al. ........ | 106/286.4 |
| 5,624,725 A * | 4/1997 | Nelson et al. ............. | 428/65.5 |
| 5,707,683 A | 1/1998 | Currie et al. | |
| 5,766,782 A | 6/1998 | Ljungberg | |
| 6,093,479 A | 7/2000 | Yoshimura et al. | |
| 6,156,383 A | 12/2000 | Ishii et al. | |
| 6,235,416 B1 * | 5/2001 | Konig et al. ................ | 428/701 |
| 6,660,371 B1 * | 12/2003 | Westphal et al. ........... | 428/697 |
| 6,827,976 B2 * | 12/2004 | Derflinger et al. ....... | 427/249.1 |

FOREIGN PATENT DOCUMENTS

| | | | |
|---|---|---|---|
| DE | 3640086 A | | 7/1987 |
| DE | 288631 A | | 4/1991 |
| DE | 29818029 U | | 3/1999 |
| EP | 149449 | * | 7/1985 |
| EP | 302984 | * | 2/1989 |
| JP | 53122687 A | | 10/1978 |
| JP | 63-060282 | * | 3/1988 |
| JP | 08-003750 | * | 1/1996 |

OTHER PUBLICATIONS

Government Paper Specification Standards, Feb. 1999, No. 11, p. 65.*
Patent Abstracts of Japan, for Citation CC (JP 53122687), "Copyright 1978, JPO&Japio".
International Search Report—Int'l Appln. No. PCT/CA 02/01570; search completed Jan. 27, 2003.

* cited by examiner

*Primary Examiner*—Archene Turner
(74) *Attorney, Agent, or Firm*—McAndrews, Held & Malloy, Ltd.

(57) ABSTRACT

According to an embodiment of the present invention, a decorative hard coating comprises zirconium-aluminium oxycarbonitride. According to another embodiment of the present invention, a decorative hard coating comprises an underlayer and an overlayer, wherein the underlayer comprises metal-rich oxycarbonitride, and the overlayer comprises aluminium in some form. According to another embodiment of the present invention, a method of making a metallic white decorative coating comprises providing a substrate and forming a layer of zirconium-aluminium oxycarbonitride over the substrate. According to another embodiment of the present invention, a method of making a metallic white decorative coating comprises providing a substrate, forming a layer of metal-rich oxycarbonitride over the substrate, and forming a layer of aluminium or aluminium-rich oxycarbonitride over the layer of metal-rich oxycarbonitride.

13 Claims, No Drawings

DECORATIVE HARD COATING AND METHOD FOR MANUFACTURE

FIELD OF THE INVENTION

The present invention relates to the field of decorative hard coatings, and the producing thereof.

BACKGROUND OF THE INVENTION

Decorative hard coatings with a variety of color appearances have been introduced to the market in at least the past twenty years for surface finishing in innumerable applications, for example, in house-hold appliances, kitchen/bathroom accessories, door accessories, automobile parts, watches, jewelery, and many other articles and apparatuses. The most successful decorative hard coatings are TiN, TiCN, ZrN and ZrCN because such coatings can simulate a variety of gold colors and at the same time possess a Vickers hardness of about 20 GPa. The production of such coatings by physical vapor deposition is well known. (See, for example, Johnson, P. C., "The Cathodic Arc Plasma Deposition of Thin Films", in *Thin Film Processes II* edited by Vossen & Kern, Academic Press Inc., San Diego, USA, 1991, pp. 209-280.)

Coatings have also been developed that have colors other than gold. For example, decorative black hard coatings exist that are discussed in U.S. Pat. No. 4,524,106 and U.S. Pat. No. 4,758,280. Hard coatings with a bright metallic white appearance also exist. Bright metallic white hard coatings are dominated in the marketplace by chromiun coatings and nickel coatings, which are produced most practically by electrochemical plating techniques. (See, for example, ASM Metals Handbook, Volume 5 Surface cleaning finishing and coating, 9th ed., ASM, Ohio, 1982; and ASM Specialty Handbook—Tool Materials, Davis, J. R., ed., ASM, Ohio, 1995.)

The dominant chromium and nickel coatings can only reach a Vickers hardness of about 10-11 GPa. Typically, chromium has a light bluish tint and nickel a light greyish tint, and thus these coatings are not as bright metallic white as some more expensive metals such as silver, platinum, rhodium, and palladium. Accordingly, the coatings are sometimes over-coated by the more expensive metals. Furthermore, concerns about environmental pollution have led to a steady reduction in the electrochemical production of hard chromium coatings. As for hard nickel coatings, human skin allergy has practically wiped out their use in the watch and jewellery industries.

SUMMARY OF THE INVENTION

What is needed are new hard coatings with good hardness and with good metallic white appearance. What is also needed are methods for producing such new hard coatings.

According to an embodiment of the present invention, a coating is preferably harder than chromium and nickel coatings, and the coating is preferably more bright metallic white than are chromium and nickel coatings.

According to an embodiment of the present invention, a decorative hard coating comprises zirconium-aluminium oxycarbonitride.

According to another embodiment of the present invention, a coated article comprises a substrate and a decorative hard coating above the substrate that comprises oxycarbonitrides of zirconium and aluminium.

According to another embodiment of the present invention, a decorative hard coating comprises an aluminium or aluminium-rich oxycarbonitride layer on a zirconium-rich oxycarbonitride layer.

According to another embodiment of the present invention, a decorative hard coating comprises an aluminium or aluminium-rich oxycarbonitride layer overlying a stainless steel-rich oxycarbonitride layer.

According to another embodiment of the present invention, a decorative hard coating comprises an underlayer and an overlayer, wherein the underlayer comprises metal-rich oxycarbonitride, and the overlayer comprises aluminium in some form.

According to another embodiment of the present invention, a method of making a metallic white decorative coating comprises providing a substrate and forming a layer of zirconium-aluminium oxycarbonitride over the substrate.

According to another embodiment of the present invention, a method of making a metallic white decorative coating comprises providing a substrate, forming a layer of metal-rich oxycarbonitride over the substrate, and forming a layer of aluminium or aluminium-rich oxycarbonitride over the layer of metal-rich oxycarbonitride.

Other embodiments of the present invention would be readily apparent to one of ordinary skill in the art, given the disclosure of the present document.

DETAILED DESCRIPTION OF SPECIFIC EMBODIMENTS

The description above and below of the present document focus on the currently preferred embodiment of the present invention and also describe some exemplary optional features and alternative embodiments. The description is for the purpose of illustration and not limitation.

As mentioned above in an earlier section, what is needed are new hard coatings, and methods for their manufacture, that have good hardness and good metallic white appearance. For example, according to merely one embodiment of the invention, the coating is preferably harder than chromium and nickel coatings, and the coating preferably has color that is more similar to the colors of silver, platinum, rhodium, and palladium than are the colors of chromium and nickel coatings. For convenience, hardness is described using the well-known Vickers hardness quantity, as in an earlier section above. For convenience, color is described using the well-known CIELAB color coordinate system of the Commission International d'Eclairage. For example, silver, platinum, rhodium, and palladium typically have CIELAB values of $L \approx 80$, $|a| \leq 1$, and $|b| \leq 1$. Increasing the brightness of a material increases its L value, and increasing the yellowness of a material increases its b value on the positive axis.

Metal coatings of zirconium, aluminium, titanium, chromium, or a mixture of these metals, and stainless steel can be deposited to a work-piece by evaporation, sputtering or arc deposition. However, the mechanical hardness of these metals is not particularly high. For example, they possess a Vickers hardness that is generally much less than 10 GPa, which is a hardness that can be achieved by the conventional electrochemically plated hard chromium and bright nickel coatings.

The hardness of at least most of the above-mentioned metal coatings can be increased by adding nitrogen into the coatings during the deposition process. For example, it has been known that stoichiometric zirconium nitride, titanium nitride, and chromium nitride possesses a Vickers hardness close to or over 20 GPa (as reviewed by Johnson). Unfortunately, the addition of nitrogen into zirconium and titanium metal films gives a yellowish tint to the films (thereby increasing the CIELAB b value). The yellow tint is not helpful for producing hard coatings that are preferably more bright metallic white than chromium and nickel coatings. Chromium nitride is also unsuitable for producing sufficiently bright metallic white hard coatings because chromium nitride is known to be greyish in color.

Oxygen and carbon can be further added during preparation of the above-mentioned nitride coatings to further increase hardness and alter the color of the coatings. For example, oxycarbonitrides of zirconium may be formed. Unfortunately, oxygen and carbon are not effective in bringing the color of the coatings toward, for example, the bright color of silver, rhodium, palladium or platinum. In particular, while the addition of carbon can increase hardness, it often leads to a reduction of brightness (thereby lowering the CIELAB L value).

According to an embodiment of the present invention, a decorative hard coating includes oxycarbonitrides of zirconium and aluminium. The present document discloses that addition of a sufficient amount of aluminium while forming zirconium oxycarbonitride increases the brightness (thereby increasing the CIELAB L value) and increases the whiteness (thereby moving the CIELAB a and b values closer to zero) of the resulting coating while still preserving sufficient hardness in the coating for many applications. However, preferably, not too much aluminium is added because too-high aluminium concentration tends to reduce the hardness of the coating beyond what would be desirable for many applications.

Preferably, the relative proportions of the components and the purity of the coating are regulated such that desired hardness and bright whiteness is achieved or exceeded for the particular application envisioned. For example, the proportions and purity are preferably such that the coating is preferably harder than chromium and nickel coatings, and the coating preferably has color that is more similar to the colors of silver, platinum, rhodium, and palladium than are the colors of chromium and nickel coatings. For example, the proportions and purity may be regulated to ensure Vickers hardness of at least about 15 GPa and a CIELAB color scale of L of at least about 76, |a| of at most about one, and |b| of at most about six. (The vertical lines enclosing a variable have their usual meaning of "absolute value", in the present document.) For example, the Vickers hardness may be between about 15 GPa and about 25 GPa. For example, approximately L=76, a=1, and b=3 to 4 is merely one typically achievable color scale that simulates the appearance of silver, rhodium, palladium, and platinum adequately for many applications.

For example, the coating according to an embodiment of the present invention preferably includes metal-rich oxycarbonitrides of zirconium and aluminium, and the concentration of aluminium is preferably lower than that of zirconium in the coating. According to merely one particular preferred formulation of a coating, the atomic composition is about Zr:Al:N:O:C=56:10:23:7:4. Many other ratios would also produce coatings with acceptable characteristics for specific applications, for example, as discussed above, and would also fall within the present invention.

In addition to being desirably bright white and hard, the decorative hard coating that includes oxycarbonitrides of zirconium and aluminium typically tends also to be suitably corrosion-resistant and adhering for common applications.

The particular thickness of the coating to use can be chosen according to preference, based, for example, on the envisioned usage, the desired durability, and the cost. For example, about one micron of thickness is sufficient for many applications. Other thicknesses may also be considered to be useful. For example, thicknesses greater than about 0.2 micron, for example, between about 0.2 micron and about 3 microns are useful for many applications. Still other thicknesses may be chosen, if desired.

The bright metallic white hard coatings can be deposited by conventional physical vapor deposition. Sputtering deposition and arc deposition, and a combination of the two techniques have been demonstrated to be especially suitable for the practise of embodiments of the invention, as is further discussed below in the Example(s). The deposition techniques are preferably used without involvement of epitaxial growth or powder metallurgy. Any of other conventional techniques can also be used, so long as it is competent to produce the desired composition.

The constituents of the decorative hard coating can be produced to have varying relative concentrations through the thickness of the coating. For example, the coating can be formulated to be especially less yellowish toward the surface of the coating.

According to another embodiment of the present invention, a zirconium-rich zirconium oxycarbonitride film is deposited and then a thin overlayer is added. The thin overlayer may be of aluminium, or of aluminium-rich oxycarbonitride, or of zircronium-aluminium oxycarbonitride. When the yellowish tint of the underlayer is light, the gradual decrease in metallic whiteness as the overlayer is worn off in time can be tolerable. In fact, in this approach, the bulk of the coatings can be any metal-rich metal oxycarbonitride film including stainless steel films doped by nitrogen, oxygen, carbon, or a mixture of them, as long as the color of the film is considered to be somewhat close to metallic white. According to one example, for such a metal-rich metal oxycarbonitride-film underlayer, the CIELAB L value is preferably not much lower than about 76 and its CIELAB a and b values are preferably not too far from zero. (But the CIELAB values of the underlayer can be worse than the CIELAB requirements of the overall coating.) On such an underlayer, an overlayer of a metal or an alloy which gives a bright metallic white color appearance is then deposited. The embodiment that uses the overlayer and the underlayer is useful for reducing overall cost of the decorative hard coating.

The particular overall thickness of the coating, and the relative thicknesses of the overlayer and underlayer can be chosen according to preference, based, for example, on the envisioned usage, the desired durability, and the cost. For example, about one micron of overall thickness is sufficient for many applications. Other thicknesses may also be considered to be useful. For example, thicknesses greater than about 0.2 micron, for example, between about 0.2 micron and about 3 microns are useful for many applications. Still other thicknesses may be chosen, if desired.

Preferably, the relative proportions of the components and the purity of the coating are regulated in the overlayer and the underlayer such that desired hardness and bright whiteness is achieved or exceeded for the particular application envisioned. Vickers hardness of at least about 15 GPa and a CIELAB color scale of L of at least about 76, |a| of at most about one, and |b| of at most about six can be typically achieved. For example, the Vickers hardness may be between about 15 GPa and about 25 GPa. For example, approximately L=76, a=1, and b=3 to 4 is merely one typically achievable color scale that simulates the appearance of silver, rhodium, palladium, and platinum adequately for many applications.

Embodiments of the invention are discussed in further detail in the following examples.

EXAMPLE 1

A hard coating was deposited on a polished stainless steel plate by arc deposition of zirconium-rich nitride film, with a gas mixture of argon and nitrogen. Prior to the deposition of the zirconium-rich nitride film, the work pieces were ion-etched and coated by a thin layer of zirconium metal. The zirconium-rich nitride film was then deposited with its composition adjusted by the relative power for arc deposition, and the gas composition. The film properties were further fine tuned by adjusting the magnetic field strength near the cathodes and the work-pieces, and the bias voltage and temperature on the work-pieces.

For an arc deposition with a sample bias voltage of 70V and temperature of 100° C., the resultant film of one micron in thickness showed a typical CIELAB color of about L=76, a=1 and b=6, a hardness of about 18 GPa as measured by a nanoindenter, an adhesion passing the standard tape test, and a corrosion resistance passing the standard 24-hour copper-accelerated acid salt spray (CASS) test. The appearance of a pale yellowish tint failed the preferred color requirements.

The composition of films prepared in this manner had zirconium as their main constituent, with a nitrogen atomic concentration in the range of 15-25%. An increase in nitrogen would increase the hardness slightly but the CIELAB b value would further increase (more yellowish). For example, a film with a nitrogen atomic concentration of 35% gave a CIELAB color of about L=80, a=0.3, and b=9. The film was light yellowish.

EXAMPLE 2

A hard coating was deposited on a polished stainless steel plate by arc deposition of zirconium and simultaneous magnetron sputtering of aluminium, with a gas mixture of argon, nitrogen, oxygen and acetylene. Prior to the deposition of the zirconium-aluminium nitride film, the work pieces were ion-etched and coated by a thin layer of zirconium metal. The zirconium-aluminium nitride film was then deposited with its composition adjusted by the relative power for arc and sputtering, and the gas composition. The film properties were further fine tuned by adjusting the magnetic field strength near the cathodes and the work-pieces, and the bias voltage and temperature on the work-pieces.

For a power ratio of 3 kW/2 kW for arc/sputtering, bias voltage of 70V and temperature of 300° C., the resultant film of one micron in thickness showed a consistent CIELAB color of about L=76, a=1 and b=4, a hardness of about 18 GPa as measured by a nanoindenter, an adhesion passing the standard tape test, and a corrosion resistance passing the standard 24-hour CASS test. The atomic composition was Zr:Al:N:O:C=56:10:23:7:4.

EXAMPLE 3

A hard coating was deposited on a nickel-plated polished-brass plate by arc deposition of zirconium and optional magnetron sputtering of aluminium, with a gas mixture of argon, nitrogen, oxygen and acetylene. First the work pieces were ion-etched and coated by a thin layer of zirconium metal. Then a zirconium-rich nitride film was then deposited with its composition adjusted by the relative power for arc deposition, and the gas composition. The film properties were further fine tuned by adjusting the magnetic field strength near the cathodes and the work-pieces, and the bias voltage and temperature on the work-pieces. After the deposition of a one-micron thick layer, the zirconium-rich nitride deposition was switched off and a two-minute sputter-deposition of aluminium was performed, in a mixture of argon and nitrogen.

For a bias voltage of 70V and temperature of 100° C., the resultant film showed a consistent CIELAB color of about L=76, a=1 and b=4, a hardness of about 16 GPa as measured by a nanoindenter, an adhesion passing the standard tape test, and a corrosion resistance passing the standard 24 hr CASS test. The composition of the very top layer of the sample was aluminium with surface oxide of aluminium. The bulk of the film under this very top layer had a composition similar to the film with a very pale yellowish tint in Example 1.

EXAMPLE 4

A hard coating was deposited with conditions similar to those in Example 3, except that the zirconium-rich nitride layer was replaced by a stainless-steel-rich nitride layer. The properties of the resultant film were similar to those of Example 3.

In the present description, example embodiments are given with reference to specific configurations and techniques. One of ordinary skill in the art would appreciate that other embodiments having other configurations and method steps are possible. For example, any conventional production technique can be used to produce the composition of the coating(s), so long as the technique is competent to produce the desired composition. For example, relative concentrations of the coatings, of course, may be varied, and impurities may be tolerated, so long as the resulting formulations are still competent to produce desired characteristics. The other embodiments having other configurations or techniques are all within the scope of this invention, given the knowledge provided by the present description to one of ordinary skill in the art.

What is claimed is:

1. A decorative hard coating composition comprising a metal-rich zirconium-aluminium oxycarbonitride, having a lower atomic concentration of aluminium than of zirconium, wherein the total atomic amount of said aluminium and zirconium is higher than the total atomic amount of said oxygen, carbon, and nitrogen in said metal-rich zirconium-aluminium oxycarbonitride.

2. The decorative hard coating composition as in claim 1, consisting essentially of the metal-rich zirconium-aluminium oxycarbonitride.

3. The decorative hard coating composition according to claim 1, having a CIELAB color scale of L of at least about 76, |a| of at most about one, and |b| of at most about five.

4. The decorative hard coating composition according to claim 1, having a Vickers hardness of at least about 15 GPa.

5. The decorative hard coating composition according to claim 4, having a CIELAB color scale of L of at least about 76, |a| of at most about one, and |b| of at most about five.

6. A decorative hard coating composition comprising a metal-rich zirconium-aluminium oxycarbonitride, wherein the atomic concentration of aluminium is less than about one fifth of the atomic concentration of zirconium, wherein the total atomic amount of said aluminium and zirconium is higher than the total atomic amount of said oxygen, carbon, and nitrogen in said metal-rich zirconium-aluminium oxycarbonitride.

7. The decorative hard coating composition according to claim 6, having a CIELAB color scale of L of at least about 76, |a| of at most about one, and |b| of at most about five.

8. The decorative hard coating composition according to claim 6, having a Vickers hardness of at least about 15 GPa.

9. The decorative hard coating composition according to claim 8, having a CIELAB color scale of L of at least about 76, |a| of at most about one, and |b| of at most about five.

10. A decorative hard coating composition comprising a metal-rich zirconium-aluminium oxycarbonitride, having relative atomic concentrations of Zr:Al:N:O:C of approximately 56:10:23:7:4.

11. The decorative hard coating composition according to claim 10, having a CIELAB color scale of L of at least about 76, |a| of at most about one, and |b| of at most about five.

12. The decorative hard coating composition according to claim 10, having a Vickers hardness of at least about 15 GPa.

13. The decorative hard coating composition according to claim 12, having a CIELAB color scale of L of at least about 76, |a| of at most about one, and |b| of at most about five.

* * * * *